United States Patent
Samueli et al.

[11] Patent Number: 5,198,818
[45] Date of Patent: Mar. 30, 1993

[54] OVERSAMPLED DIGITAL-TO-ANALOG CONVERTER FOR MULTILEVEL DATA TRANSMISSION

[75] Inventors: Henry Samueli, Northridge; Ralph H. Brackert, Torrance, both of Calif.

[73] Assignee: PairGain Technologies, Inc., Cerritos, Calif.

[21] Appl. No.: 788,847

[22] Filed: Nov. 7, 1991

[51] Int. Cl.$^5$ ............................................. H03M 1/66
[52] U.S. Cl. ..................................... 341/144; 341/147
[58] Field of Search ............... 341/144, 147, 126, 145; 375/17, 18

[56] References Cited

U.S. PATENT DOCUMENTS

| | | | |
|---|---|---|---|
| 3,506,848 | 4/1970 | Beurrier | 307/246 |
| 3,632,996 | 1/1972 | Paine | 341/147 X |
| 3,838,414 | 9/1974 | Wiles | 341/147 |
| 4,233,591 | 11/1980 | Murata et al. | 341/145 |
| 4,532,496 | 7/1985 | Ichinose | 341/145 |
| 4,584,690 | 4/1986 | Cafiero et al. | 375/18 |
| 4,953,160 | 8/1990 | Gupta | 375/17 X |
| 5,014,054 | 5/1991 | Oshita et al. | 341/145 |

Primary Examiner—Sharon D. Logan
Attorney, Agent, or Firm—Freilich Hornbaker Rosen

[57] ABSTRACT

A digital-to-analog converter (DAC) is disclosed which uses an oversampled modulation technique followed by an analog lowpass filter to generate an output waveform with four precisely controlled amplitude levels for 2B1Q data transmission applications. The DAC accepts a 2-bit input word at the baud rate and generates one of four possible analog output amplitudes having relative ratios of $+3$, $+1$, $-1$, and $-3$.

16 Claims, 5 Drawing Sheets

B   Hybrid Balance Impedance    EC  Echo Canceller
Tx  Transmitter                 H   Hybird
Rx  Receiver                    ⊖   Subtractor

OVERSAMPLED DIGITAL-TO-ANALOG CONVERTER FOR MULTILEVEL DATA TRANSMISSION

FIELD OF THE INVENTION

This invention relates generally to data transmission systems and more particularly to a digital-to-analog converter for use therein capable of producing a multilevel analog waveform whose levels exhibit precise amplitude ratios with respect to one another.

BACKGROUND OF THE INVENTION

Digital-to-analog converters (DAC's) are widely used in data transmission systems to convert input data bits into an analog waveform for transmission over a communications channel. In high- bit rate full-duplex telecommunication systems, high-precision DAC's are generally required to achieve satisfactory performance, e.g., for echo cancellation.

"2B1Q" refers to a telecommunications format which has been adopted as a standard in basic rate Integrated Services Digital Network (ISDN) systems (e.g. See, ANSI specification T1.601-1988) operating at 80 kbaud and in high-bit rate Digital Subscriber Line (HDSL) systems operating at 392 kbaud. In accordance with the 2B1Q format, two data bits are encoded into one level of a four level (quaternary) output pulse (hence, "2B1Q").

In order to achieve satisfactory performance in such systems, it is imperative that the four levels of the output pulse bear precise amplitude ratios relative to one another; e.g., $+3, +1, -1, -3$.

The present invention is directed to digital-to-analog converters for responding to multibit data input words to produce analog output waveforms comprised of multiple levels having precisely related amplitudes.

Pulse width modulation techniques have been used in the prior art to implement digital to analog conversion, primarily for low precision audio applications. For example, U.S. Pat. No. 3,506,848 describes a circuit which integrates a pulse at a fixed rate over an interval proportional to the desired analog output level. The pulse train is then filtered to provide the final analog output. U.S. Pat. No. 4,233,591 describes a technique whereby a single integration interval is divided into multiple elementary periods. The time constant of the integrator is then sped up to enhance the response speed of the analog output. U.S. Pat. No. 4,532,496 proposes another improvement in digital waveform generation, interspersing digital "staircase" outputs to a smoothing circuit.

SUMMARY OF THE INVENTION

The present invention is directed to an oversampling digital-to-analog converter (DAC) for responding to successive multibit data words, to produce an output waveform comprised of multiple (L) analog levels whose amplitudes bear a precise relationship to one another.

A converter in accordance with the invention incorporates (1) waveform generator logic for producing L different primitive binary waveforms, each having a different DC component, and (2) select logic responsive to each multibit data word for selecting one of said primitive waveforms. The selected primitive waveform is then low pass filtered to derive one of L analog (i.e., DC voltage) levels from the DC component of the selected primitive waveform. If the data word bits are represented by $X_1,...X_m$, L typically equals $2^m$.

In a preferred embodiment, the DAC responds to a two bit $(X_1,X_2)$ data word to produce an analog waveform comprised of four levels $A_1, A_2, A_3, A_4$. The aforecited ANSI 2B1Q specification refers to these four levels as $+3, +1, -1, -3$, which should be understood as symbol names, indicative of relative amplitude only and not absolute numeric values. For convenience and clarity, this nomenclature will be adopted herein.

In accordance with a significant feature of the invention, in order to achieve a high degree of output linearity, i.e. precisely related analog amplitudes, the L (i.e., 4 in the preferred 2B1Q embodiment) primitive binary waveforms are chosen so as to have in common the following properties:

a. symmetry about their midpoints;

b. the same number of rising and falling edges; and c. start and end in the same binary state.

In a basic embodiment of the invention, the primitive binary waveforms are produced by waveform generator logic responsive to a cyclic binary counter driven at a master clock rate $f_{clk}$. During each cycle, the counter defines S counts (e.g., S=16). The DC component of each primitive binary waveform is defined by its duty cycle, that is the relative number of counts during each cycle that it is in the binary "1" and "0" states.

Preferably, the master clock rate $f_{clk}=S*N*f_{baud}$ where $f_{baud}$ represents the frequency at which two bit data words are delivered to the DAC for processing. A transmit symbol period $(1/f_{baud})$ is divided into N subintervals. During each transmit symbol period, the L primitive waveforms are concurrently generated N times with one primitive waveform being selected by the select logic for processing by a low pass filter to produce an analog output level.

Although single-ended embodiments of the invention perform satisfactorily, enhanced linearity is achieved when the primitive waveforms are used in a differential manner to generate the multilevel analog output. In such a differential implementation, during each transmit symbol period, complementary primitive waveforms are selected and then low pass filtered and amplified to produce the final analog output. More specifically, during each transmit symbol period, the selected pair of primitive waveforms is repeated N times to create a differential pulse width modulated output. The differential pulse width modulated output is then lowpass filtered and differentially amplified to produce the final analog output waveform having precisely matched amplitude levels with ratios of $+3, +1, -1,$ and $-3$.

This precise matching is primarily attributable to the aforementioned properties (a), (b), (c). The implication of property (a) is that the four primitive waveforms will have an identical group delay thus avoiding linearity degradation. The implication of property (b) is that the ratios of the average DC levels of the four primitive waveforms is insensitive to the rise and fall times of the digital logic thereby further enhancing the linearity of the analog output waveform. The implication of property (c) is that no transients will occur on any symbol transitions and therefore no linearity degradation will result. (Glitches during symbol transitions frequently degrade linearity in conventional DAC's). Further, by differentially processing the two selected primitive waveforms, perfect linearity is guaranteed between the $+3$ and $-3$ waveforms and also between the $+1$ and −1 waveforms. As a result, overall circuit performance is highly immune to component inaccuracies and very high performance is achieved with low-cost easily producible hardware.

Embodiments of the invention find particular utility where a very high degree of linearity is required. Although only two bits of information are converted during each symbol period, the ratios of the amplitudes of the resulting four level waveforms is accurate to within 1 part in 4,000 which corresponds to the accuracy of a 12-bit DAC. The linearity is determined entirely by the digital circuitry and the cutoff frequency of the analog low pass filter. As a result, the same linearity can be achieved at virtually any data rate by simply scaling the master clock frequency and changing the cut-off frequency of the filter.

DETAILED DESCRIPTION OF THE DISCLOSURE

Figure 1:
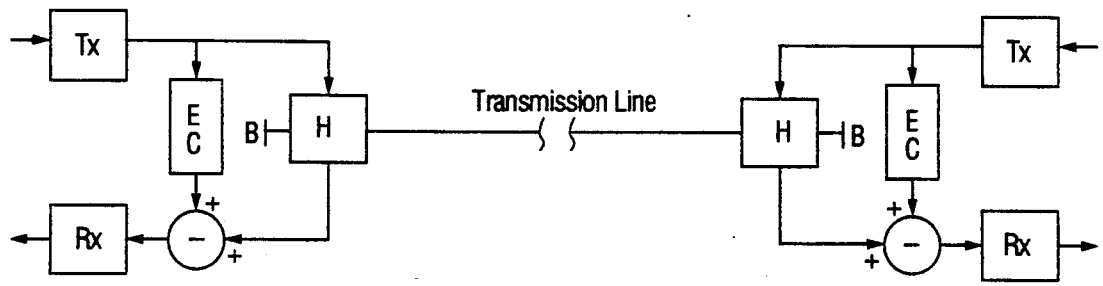
FIG. 1 is a block diagram depicting a typical data transmission system in which a digital-to-analog converter in accordance with the invention can be advantageously used.
Figure 2:
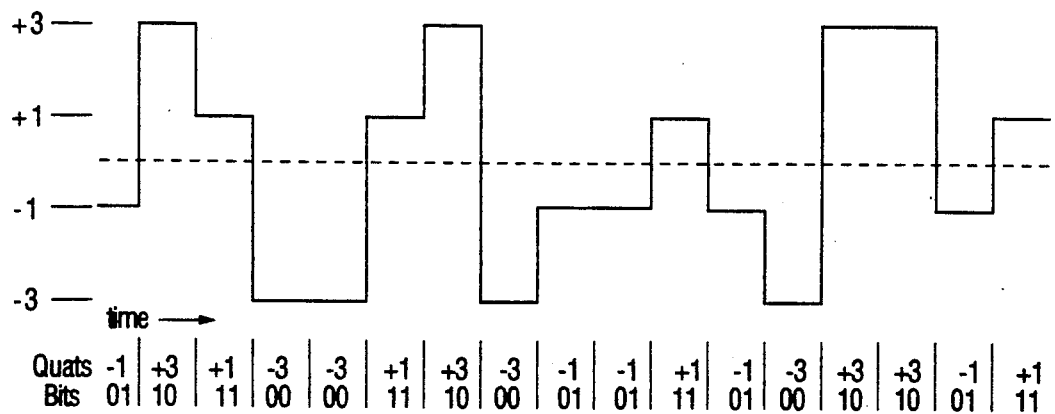
FIG. 2 is a waveform diagram depicting the known 2B1Q format.

Attention is initially called to FIGS. 1 and 2 which have been extracted from the aforecited ANSI specification T1.601-1988 to show an exemplary application of a digital to analog converter in accordance with the present invention. A 2B1Q transmission system in accordance with the ANSI specification uses the echo canceler with hybrid (ECH) principle depicted in FIG. 1 to provide full duplex operation over a two wire subscriber loop. In such a configuration, the echo canceler (EC) produces a replica of the echo of the near end transmission which is then subtracted from the total received signal.

The line code specified is 2B1Q which requires that two input bits be converted to a four level output. More specifically, each successive pair of bits in the binary data stream is converted to a quaternary symbol (four level) to be output from the transmitter at the interface, as specified below:

| First Bit (Sign) | Second Bit (Magnitude) | Quaternary Symbol (Quat) |
| --- | --- | --- |
| 1 | 0 | +3 |
| 1 | 1 | +1 |
| 0 | 1 | −1 |
| 0 | 0 | −3 |

The four values listed under "Quaternary Symbol" in the table should be understood as symbol names, indicative of relative amplitude only, and not absolute numeric values.

FIG. 2 is an example of 2B1Q pulses over time. Square pulses are used only for convenience of illustration and do not in any way represent the specified shape of real 2B1Q pulses. Quat identifications and bit representations are given beneath the waveform of FIG. 2. Time flows from left to right.

Figure 3:
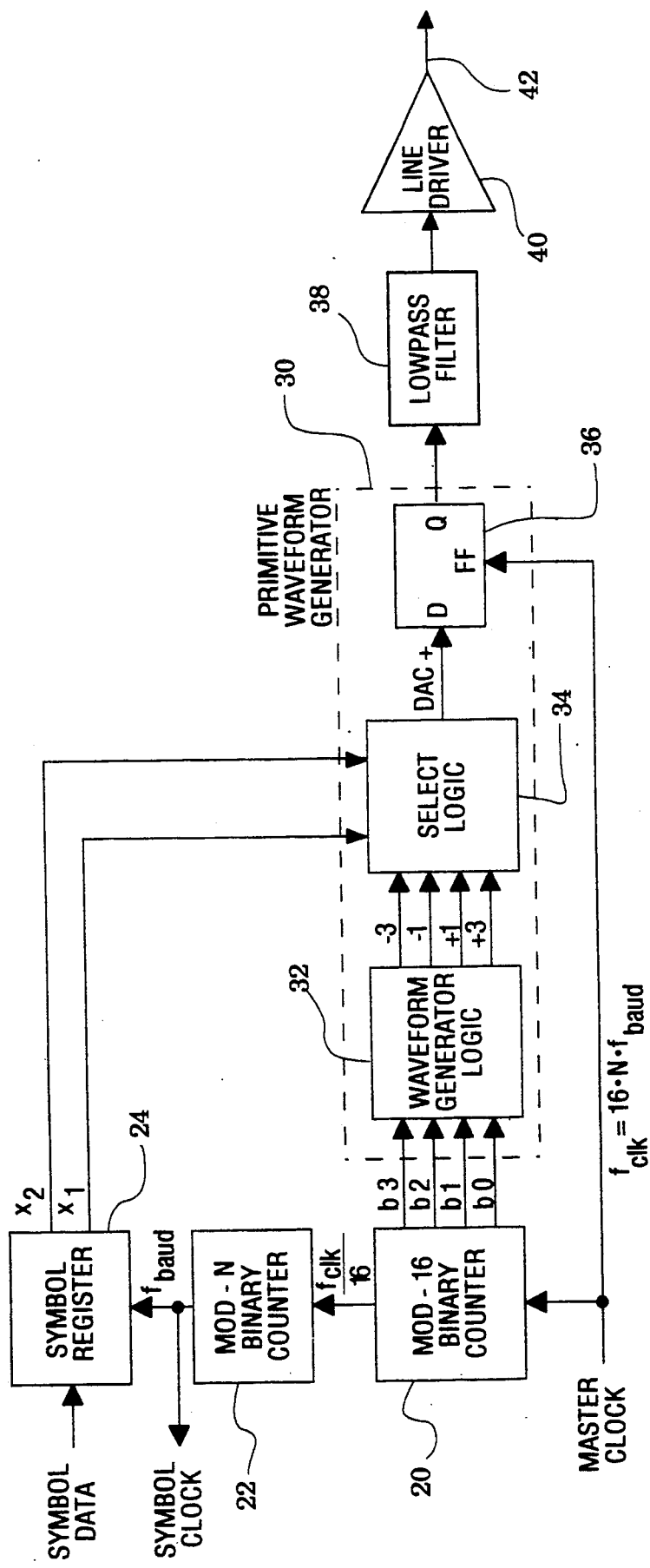
FIG. 3 is a block diagram of a basic single-ended DAC in accordance with the present invention.

Attention is now directed to FIG. 3 which comprises a block diagram of a basic single ended digital-to-analog converter (DAC) in accordance with the present invention. The DAC of FIG. 3 includes a cyclic binary counter 20 which is depicted as a four stage modulo 16 counter. The four outputs of counter 20 are respectively identified as b0, b1, b2, and b3 from least to most significant bits. The counter 20 is driven by a master clock signal at frequency $f_{clk}$. For purposes of the preferred embodiments disclosed herein, $f_{clk}=16*N*f_{baud}$ where $f_{baud}$ represents the rate at which data input words are processed by the system.

The signal $f_{clk}/16$ is applied to a divide by N binary counter 22 to produce a signal of frequency $f_{baud}$ which functions as the symbol clock to gate symbol data input words into the symbol register 24. In the preferred embodiments disclosed herein, each data input word is assumed to be comprised of two bits, i.e. $X_1$, $X_2$.

The converter of FIG. 3 includes a primitive waveform generator 30 comprised of waveform generator logic 32 and select logic 34. The waveform generator logic 32 is responsive to the four output lines, b0, b1, b2, b3 of the binary counter 20 to produce different primitive binary waveforms, respectively identified as −3, −1, +1, and +3 on its four output lines. The waveform generator logic 32 is implemented in accordance with the following Boolean equations to produce the primitive binary waveforms depicted in FIG. 4:

$$-3 = \overline{b3}.b2.b1.b0 + b3.\overline{b2}.\overline{b1}.\overline{b0}$$

$$-1 = \overline{b3}.b2.b0 + \overline{b3}.b2.b1 + b3.\overline{b2}.\overline{b1} + b3.\overline{b2}.\overline{b0}$$

$$+1 = \overline{b3}.b2 + b3.\overline{b2} + \overline{b3}.b1.b0 + b3.\overline{b1}.\overline{b0}$$

$$= b3 \oplus b2 + \overline{b3}.b1.b0 + b3.\overline{b1}.\overline{b0}$$

$$+3 = b0.b1.b2.b3 + \overline{b0}.\overline{b1}.\overline{b2}.\overline{b3}$$

Figure 4:
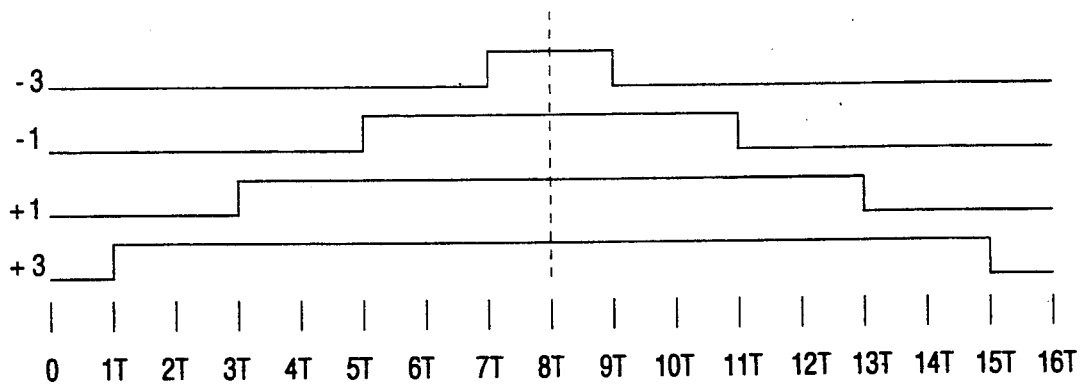
FIG. 4 is a diagram depicting the four primitive binary waveforms produced by the generator logic of FIG. 3.

Note that FIG. 4 illustrates one cycle, comprised of sixteen clock periods ($T=1/f_{clk}$) of binary counter 20. Note that each of the four primitive binary waveforms is symmetric about the mid-point of the sixteen clock period cycle and consists of three parts; i.e., a binary "0" logic-level internal followed by at binary "1" high logic-level interval and ending with a low logic-level interval. It is also pointed out that each of the primitive waveforms has the same number of rising and falling edges, i.e. one rising edge and one falling edge per cycle. Also note, that each of the primitive waveforms starts and ends in the same binary state, i.e., at binary "0" (low). The four primitive waveforms differ from one another in the number of clock periods in which the waveform is at binary "1" (high), as follows:

| +3 | 14T |
| --- | --- |

-continued

| | |
|---|---|
| +1 | 10T |
| −1 | 6T |
| −3 | 2T |

As implemented, of course, the binary "0" and "1" states are represented by different voltage levels and thus a different DC component is associated with each primitive binary waveform. In accordance with a preferred embodiment of the invention, to satisfy the 2B1Q standard as expressed in the aforecited specification, the DC component of the four primitive waveforms bear a relationship relative to one another of +3, +1, −1, −3.

The select logic 34 is responsive to the data input word $X_1$, $X_2$ to select a particular one of the four primitive binary waveforms. The state of the selected primitive waveform is output by the select logic 34 as DAC+ and stored during each clock interval in flip flop 36. The output of flip flop 36 is applied to a low pass filter 38 which converts the DC component of the selected primitive waveform to an analog output level. Line driver 40 responds to the output of filter 38 to apply to transmission line 42 an output analogous to that depicted in FIG. 2.

Figure 5:
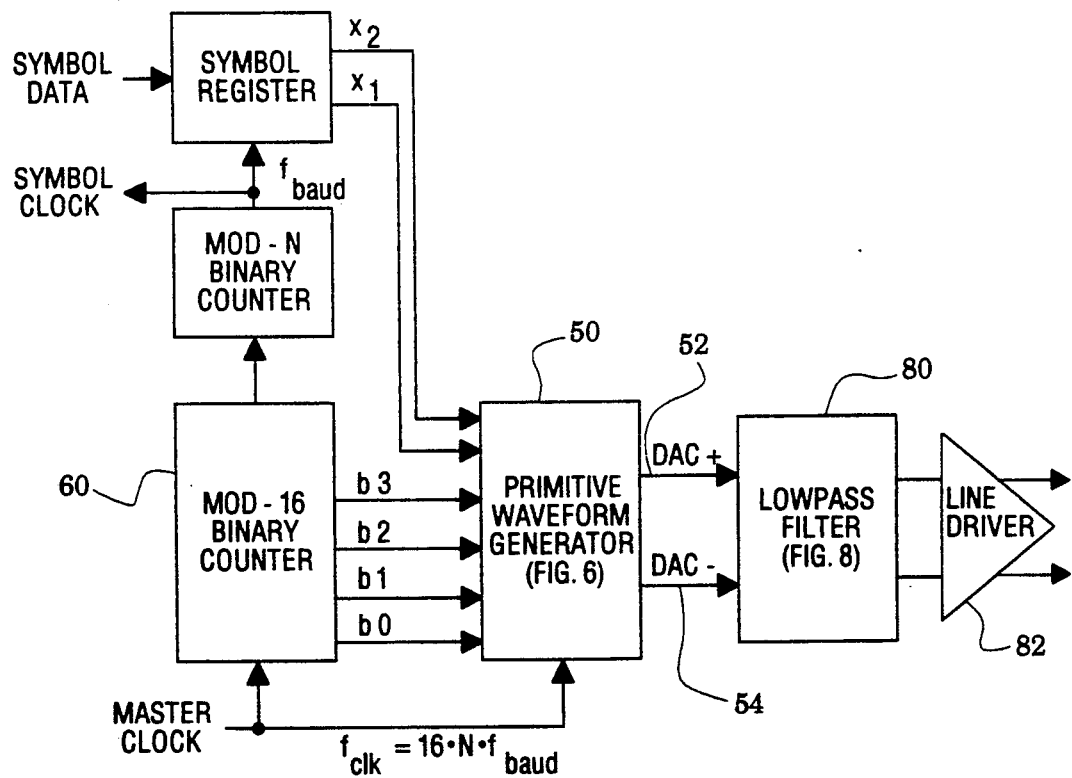
FIG. 5 is a block diagram of preferred differential DAC in accordance with the present invention.
Figure 6:
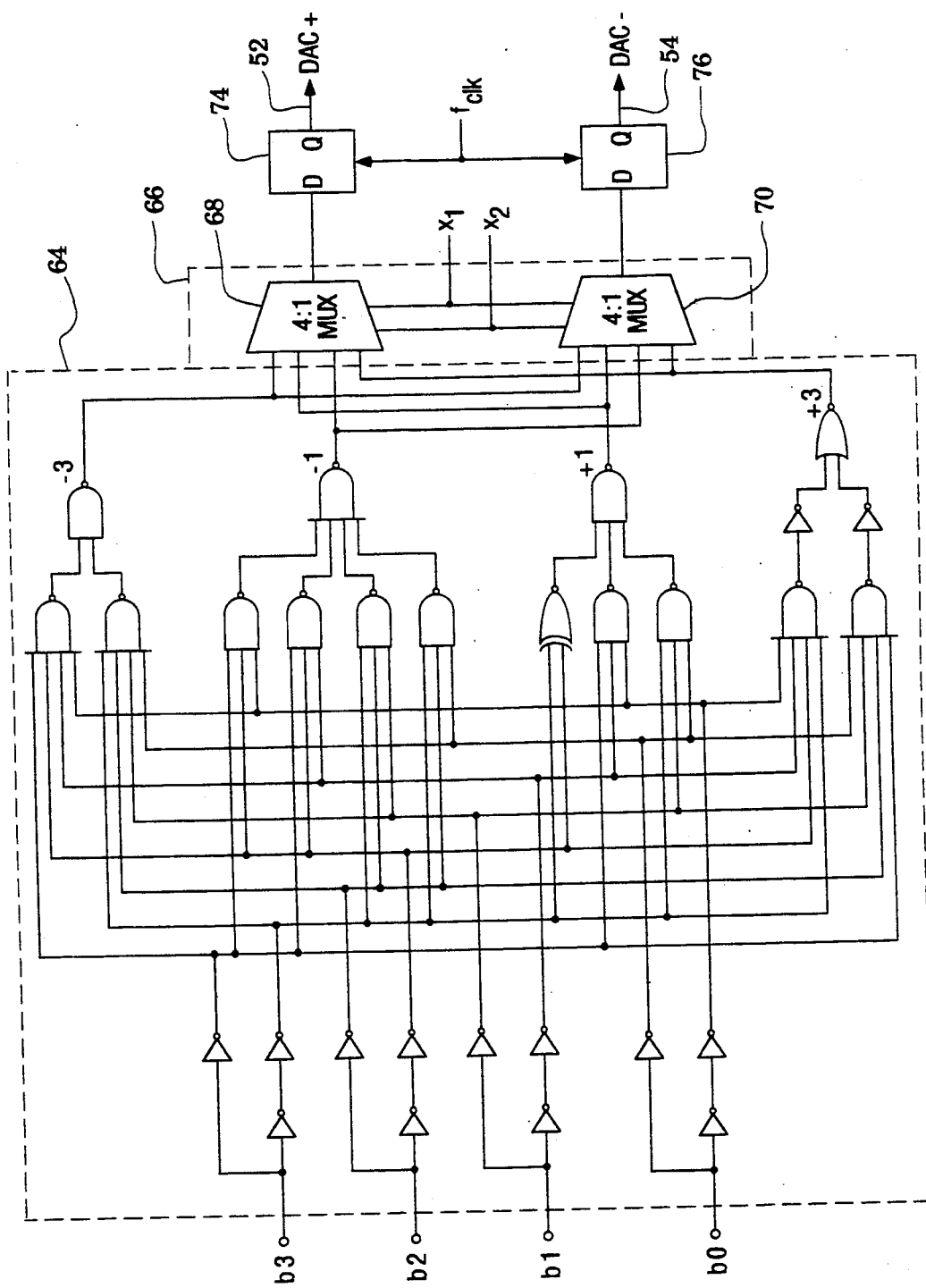
FIG. 6 is a logic diagram depicting the waveform generator logic of FIG. 5.

Attention is now directed to FIG. 5 which illustrates a preferred embodiment of the invention, similar to the single-ended DAC embodiment of FIG. 3, but differing therefrom in that a pair of primitive binary waveforms are differentially used to produce the analog output level. Note in FIG. 5 that the primitive waveform generator 50 is depicted as providing output signals DAC+ on terminal 52 and DAC− on terminal 54. FIG. 6 illustrates a block diagram of a preferred implementation of the primitive waveform generator 50. Note that the waveform generator of FIG. 6 responds to inputs b0, b1, b2, b3 from the mod-16 binary counter 60. Logic 64 is configured to implement the aforementioned Boolean equations to produce the +3, +1, −1, and −3 primitive binary waveforms depicted in FIG. 4. These waveforms are represented in FIG. 6 as being applied to select logic 66 comprised of first and second 4:1 multiplexors 68 and 70. The multiplexors 68 and 70 are responsive to the applied data input word $X_1$, $X_2$ to couple the selected primitive waveforms to flip flops 74 and 76 which are clocked at the master clock rate $f_{clk}$. The outputs of flip flops 74 and 76 are applied to the aforementioned terminals 52 and 54 as the signals DAC+ and DAC−.

Figure 7:
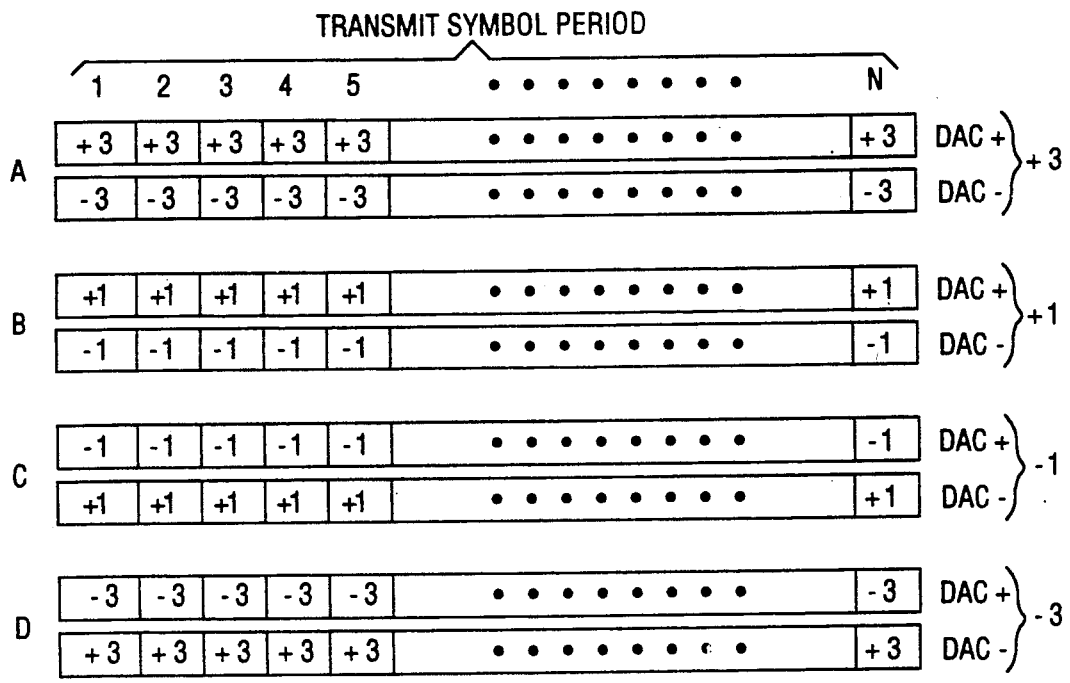
FIG. 7 is a diagram depicting how complementary primitive waveforms are combined to generate differential digital waveforms.

FIG. 7 depicts how the primitive waveforms are differentially combined to produce the analog output levels +3, +1, −1, −3. In FIG. 7A, a +3 primitive waveform is repeated N times during a single transmit symbol period and delivered to the DAC+ terminal 52, along with the −3 primitive waveform which is delivered to the DAC− terminal 54. Similarly, the +1 analog output level is produced as shown in FIG. 7B by differentially combining over N cycles the +1 primitive which is delivered to the DAC+ terminal 52 and the −1 primitive delivered to the DAC− terminal 54. The −1 analog output level depicted in FIG. 7C is produced by differentially combining the −1 primitive waveform applied to the DAC+ terminal 52 with the +1 primitive waveform applied to the DAC− terminal 54. FIG. 7D shows the −3 primitive waveform applied to the DAC+ terminal being combined with the +3 primitive waveform applied to the DAC− terminal to produce the −3 analog output level.

Note in FIG. 7A-7D, that in all cases the differential output is formed by selecting complimentary primitive waveforms.

Figure 8:
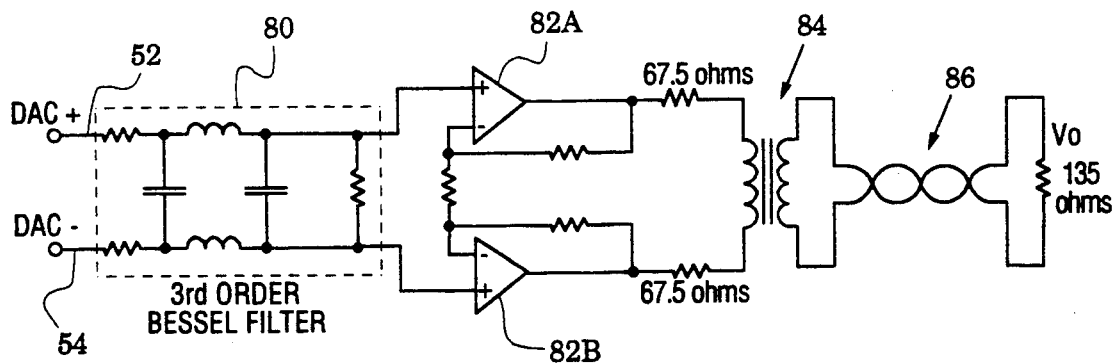
FIG. 8 is a circuit diagram of a low pass filter suitable for use in FIG. 5.

The waveform generator output terminals 52, 54 are applied to low pass filter 80 and then to line driver 82 as depicted in FIG. 5. FIG. 8 illustrates an exemplary analog low pass filter circuit 80 which responds to the DAC+ and DAC− signals to produce the inputs to line drivers 82A and 82B. The outputs from line drivers 82A and 82B are then coupled via transformer 84 to transmission line 86.

In order to perform satisfactorily in the 2B1Q environment represented in FIGS. 1 and 2, it is very important that the multilevel analog waveforms produced by the line drivers have levels whose amplitudes are related by precise ratios, i.e., +3, +1, −1, −3. As an example, using an oversampling factor of 96 and a low order analog low pass filter with a 3 dB cutoff frequency $f_c$ at half the baud rate, the amplitude ratios of a four level analog output produced by the embodiment of FIG. 5, are matched to better than 0.03 percent accuracy, which corresponds to an effective linearity of better than 70 dB. Linearity is defined as the worst case difference between the normalized amplitudes of the four analog output levels at the output of the lowpass filter. This can be analytically determined by integrating the differences in the frequency spectrums of the filtered output pulse waveforms.

When the four primitive waveforms of FIG. 4 are repeated N times as represented in FIG. 7, the resulting frequency spectrums are given by $$X_i(f) = \{[2\sin[(i+4)2\pi fT] - \qquad (1)$$

$$\sin(16\pi fT)]\sin(16N\pi fT)\}/[16N\pi fT\sin(16\pi fT)]$$

$$i = -3, -1, +1, +3$$

Equation (1) ignores the phase term which is identical for all four waveforms and thus is not relevant for the linearity calculation.

For simplicity if the output lowpass filter is assumed to be a brickwall filter with a cut-off frequency equal to $f_c$ then the resulting linearity of the differential output DAC of FIG. 5 is given by $$L = 20\log_{10}\left[2\int_0^{f_c} [|X_{+1}(f)| - \qquad (2)\right.$$

$$\left.|X_{-1}(f)| - \tfrac{1}{3}|X_{+3}(f)| + \tfrac{1}{3}|X_{-3}(f)|\right] df$$

The following table shows the achievable linearity of the DAC of FIG. 5 as a function of oversamplinq factor. The calculations were made assuming a lowpass filter cut-off frequency $f_c$ equal to half the baud rate. As shown in the table, for an oversampling factor of 96 (which corresponds to N=6), a linearity of 74 dB is achieved which is equivalent to 12-bits of resolution. The linearity results listed do not change appreciably when a low-order (3rd-5th order) lowpass filter is used, as long as the 3 dB cut-off frequency remains fixed at half the baud rate.

NUMERICAL RESULTS

ASSUME $f_c = \dfrac{f_{baud}}{2}$

| N | OVERSAMPLING FACTOR | LINEARITY (dB) SINGLE ENDED | DIFFERENTIAL |
|---|---|---|---|
| 2 | 32 | 21 | 54 |
| 4 | 64 | 33 | 66 |
| 6 | 96 | 40 | 74 |
| 8 | 128 | 45 | 79 |
| 10 | 160 | 49 | 82 |
| 12 | 192 | 52 | 85 |
| 14 | 224 | 55 | 88 |
| 16 | 256 | 58 | 91 |

From the foregoing, it should now be recognized that a method and apparatus has been disclosed herein for producing a multilevel analog output whose levels exhibit a high degree of linearity while requiring only relatively simple digital logic combined with a simple analog filter. The disclosed DAC embodiments are especially suitable for generating 2B1Q waveforms at any baud rate including the basic ISDN baud rate of 80 kbaud and the high bit rate digital subscriber line rate of 392 kbaud. Implementation of the disclosed embodiments yields very high linearity attributable in large part to the characteristics of the selected primitive binary waveforms. For example, as long as all primitive waveforms have the same number of rising and falling edges, linearity is independent of the actual rise and fall times of the digital logic. Additionally, linearity is independent of the absolute values of the high and low voltage levels of the digital logic, as well as being independent of the propagation delays therethrough. Likewise, linearity is insensitive to the values of the components in the analog lowpass filter. In the differential version of FIG. 5, linearity is also insensitive to unmatched propagation delays in the two differential output signal paths and is also independent of gain imbalances in the two differential signal paths as well as offset voltages in the differential amplifier.

Although the embodiments depicted herein have been particularly directed to 2B1Q applications in which two input bits produce a four level (quaternary) analog output, the teachings of the invention are easily extendable. For example, an eight level output waveform can be readily produced by generating a set of eight primitive binary waveforms having substantially the same characteristics as depicted in FIG. 4.

We claim:

1. Digital to analog converter apparatus responsive to a multibit data input word for producing a multilevel analog output, said apparatus comprising:

cyclic binary counter means for counting at a clock frequency $f_{clk}$;

generator logic means responsive to said counter means for producing during each counter means cycle multiple primitive binary waveforms, each such waveform defining a different DC component;

select logic means responsive to said data input word for selecting one of said multiple primitive binary waveforms; and low pass filter means for producing an analog output level related to the DC component of said selected binary waveform.

2. The apparatus of claim 1 wherein each counter means cycle defines a midpoint and each of said primitive binary waveforms is symmetric with respect to said midpoint.

3. The apparatus of claim 1 wherein all of said primitive binary waveforms have the same number of rising and falling edges.

4. The apparatus of claim 1 wherein each of said primitive binary waveforms is comprised of binary "0" and binary "1" states and wherein all of said primitive binary waveforms start and end each cycle in the same binary state.

5. The apparatus of claim 1 wherein said counter means defines a plurality of counts during each cycle; and wherein said DC component of each primitive binary waveform is determined by the number of counts during each cycle that the waveform defines a binary "0" state as compared to a binary "1" state.

6. Apparatus capable of producing L different analog output levels, each representative of a differently configured m bit data input word where $L=2^m$, said apparatus comprising:

primitive waveform generator means for concurrently generating L different primitive binary waveforms, each such waveform having a different DC component;

select logic means responsive to each of a sequence of m bit data input words for selecting at least one of said primitive binary waveforms; and output means responsive to said selected primitive binary waveforms for producing an analog output level related to the DC component thereof.

7. The apparatus of claim 6 wherein said generator means repetitively generates each of said primitive binary waveforms over a plurality of cycles.

8. The apparatus of claim 7 wherein each counter means cycle defines a midpoint and each of said primitive binary waveforms is symmetric with respect to said midpoint.

9. The apparatus of claim 7 wherein all of said primitive binary waveforms have the same number of rising and falling edges during each cycle.

10. The apparatus of claim 7 wherein each of said primitive binary waveforms is comprised of binary "0" and binary "1" states and wherein all of said primitive binary waveforms start and end each cycle in the same binary state.

11. The apparatus of claim 6 including means for applying data input words to said select logic means at a rate of $f_{baud}$;

binary counter means for cyclically counting at a clock frequency $f_{clk}=S.N.f_{baud}$ where S defines the number of counts per cycle of said counter means and N defines the number of cycles of said counter means during a period in which a single data input word is to be transmitted; and wherein said waveform generator means is responsive to said counter means for generating said L different waveforms during each counter cycle.

12. The apparatus of claim 11 wherein m=2, L=4 and S=16.

13. The apparatus of claim 12 wherein said L different primitive binary waveforms have DC components bearing the following amplitude ratios relative to one another: +3, +1, −1, −3.

14. The apparatus of claim 6 wherein said select logic means in response to each data input word selects two of said primitive binary waveforms; and means for differentially applying said two selected waveforms to said output means.

15. The apparatus of claim 6 wherein said output means includes low pass filter means.

16. A method of producing L different analog output levels, where L is an integer greater than 1, each representative of a differently configured data input word comprised of m bits where m is an integer greater than 1 and where $L=2^m$, said method comprising:

concurrently generating L different primitive binary waveforms, each such waveform having a different DC component;

selecting at least one of said primitive binary waveforms in response to each data input word; and producing an analog output level related to the DC component of the selected primitive binary waveform.

* * * * *